United States Patent
Probst et al.

(10) Patent No.: US 11,049,956 B2
(45) Date of Patent: Jun. 29, 2021

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Dean E. Probst, West Jordan, UT (US); Jeffery A. Neuls, Beaverton, OR (US); Masaichi Eda, Gresham, OR (US); Peter A. Burke, Portland, OR (US); Peter McGrath, Portland, OR (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 136 days.

(21) Appl. No.: 16/545,826

(22) Filed: Aug. 20, 2019

(65) Prior Publication Data
US 2020/0395468 A1     Dec. 17, 2020

Related U.S. Application Data

(60) Provisional application No. 62/862,387, filed on Jun. 17, 2019.

(51) Int. Cl.
*H01L 29/40*     (2006.01)
*H01L 29/66*     (2006.01)
*H01L 29/423*    (2006.01)

(52) U.S. Cl.
CPC .... *H01L 29/66666* (2013.01); *H01L 29/4236* (2013.01)

(58) Field of Classification Search
None
See application file for complete search history.

(56) References Cited

U.S. PATENT DOCUMENTS

| | | | |
|---|---|---|---|
| 8,716,783 B2 | 5/2014 | Herrick et al. | |
| 2013/0228857 A1* | 9/2013 | Lee | H01L 29/66727 257/330 |
| 2013/0277736 A1 | 10/2013 | Kalnitsky et al. | |
| 2013/0323921 A1* | 12/2013 | Burke | H01L 21/02271 438/589 |
| 2014/0252460 A1 | 9/2014 | Lee et al. | |
| 2014/0346575 A1 | 11/2014 | Chen et al. | |
| 2015/0145037 A1 | 5/2015 | Lee et al. | |
| 2015/0171201 A1 | 6/2015 | Lui et al. | |
| 2016/0064551 A1 | 3/2016 | Lee et al. | |
| 2016/0300917 A1 | 10/2016 | Xue et al. | |
| 2016/0315053 A1* | 10/2016 | Pan | H01L 23/552 |

\* cited by examiner

*Primary Examiner* — Bradley Smith
(74) *Attorney, Agent, or Firm* — Robert F. Hightower (57) ABSTRACT

In one embodiment, a method of forming a semiconductor device forms gate trenches in a semiconductor substrate. A portion of the material between the trenches is narrowed and another material is formed on sidewalls of the narrowed portion that is substantially not etched by an etchant that etches the material of the portion of the material between the trenches. Source and gate contact openings are formed together.

20 Claims, 9 Drawing Sheets

METHOD OF FORMING A SEMICONDUCTOR DEVICE

CROSS-REFERENCE TO RELATED APPLICATIONS

This application claims the benefit of U.S. Provisional Patent Application No. 62/862,387, filed on Jun. 17, 2019, the entire contents of which is incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form trench type metal oxide semiconductor field effect transistors (MOSFETs). As process technology allowed smaller device pitches, it became more difficult to provide reliable contacts to the MOSFET. In some manufacturing techniques, contacts became misaligned which sometimes raised the Rdson of the MOSFET. The higher Rdson resulted in poor performance or alternately higher manufacturing cost. In some applications, misalignment of some of the MOSFET features resulted in degrading the unclamped inductive switching (UIS) performance.

In some other manufacturing techniques, different masking and etching operations were utilized to form the source and gate contacts. These different operations for the two contacts resulted in higher manufacturing cost for the MOSFET.

Accordingly, it is desirable to have a manufacturing technique that provides more reliable contacts, that provides a more reliable Rdson, that reduces the manufacturing operations, or/and that reduces the manufacturing cost.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten per cent (10%) (and up to twenty per cent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, in some embodiments in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

Figure 1:
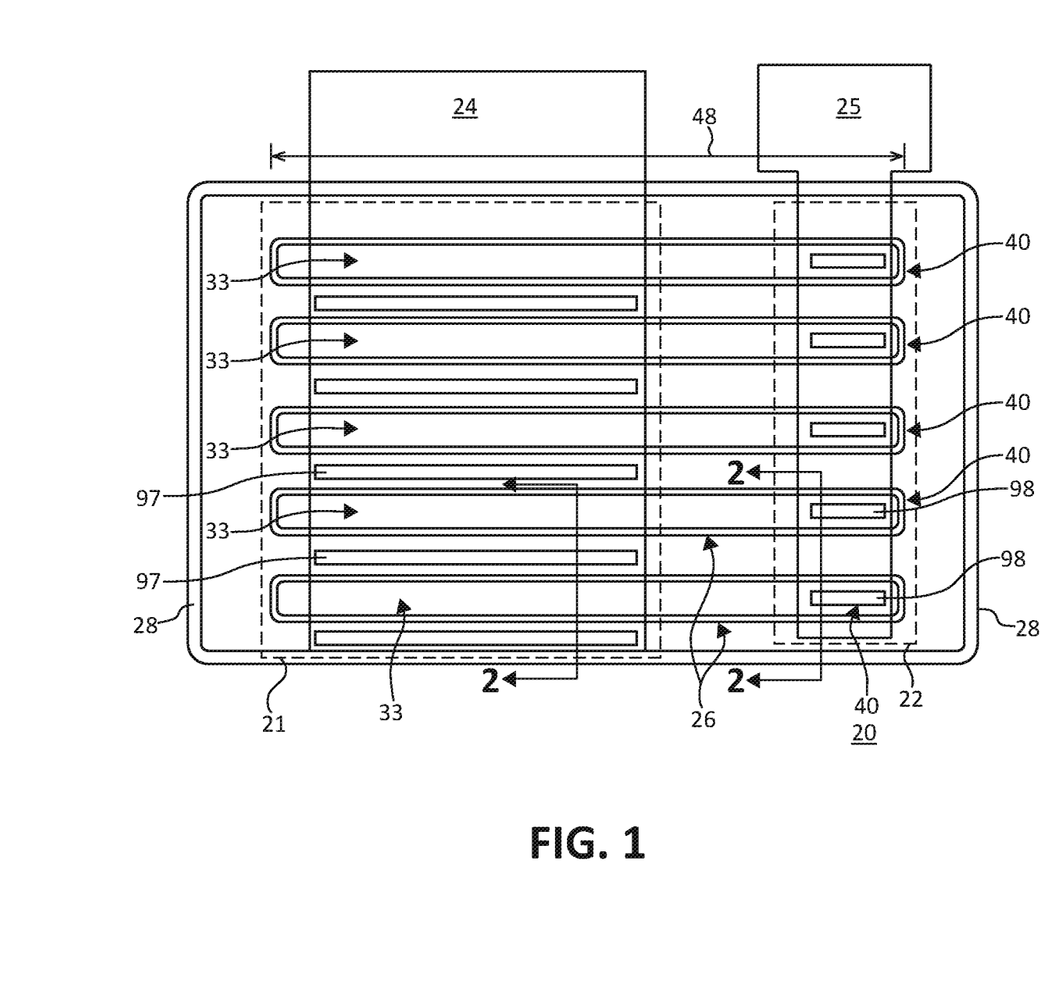
FIG. 1 illustrates an example of an enlarged plan view of a portion of an embodiment of a semiconductor device in accordance with the present invention.

FIG. 1 illustrates an example of an enlarged plan view of a portion of an embodiment of a semiconductor device 20 that is formed using improved manufacturing techniques. In an embodiment, device 20 may include a trench type MOSFET. Device 20 includes an active section 21 that is configured to conduct current between the active elements that are within section 21. For example, section 21 may be configured to form a channel region that selectively allows current to flow from a source region to a drain region of the trench type MOSFET. Device 20 also includes a non-active section 22 which facilitates making an electrical connection to portions of device 20 that are within section 21 but does not conduct a current to flow through device 20, although some current may flow into section 22 to charge parasitic capacitances, etc.

In the embodiment of a trench type MOSFET, device 20 includes a plurality of gate trenches 26. Each trench 26 has an active portion 33 that is within section 21 and also has a length 48 such that a non-active portion 40 of each trench 26 is within section 22. A gate electrode 25 extends into section 22 and overlies non-active portion 40 of trenches 26 but does not extend into active section 21. A source electrode 24 extends into section 21 and overlies active portion 33 of trenches 26 but does not extend into non-active section 22. A termination trench 28 may be formed to surround sections 21 and 22 to isolate device 20 from other devices. In some embodiments, trench 28 may have a different construction and may be in a different location relative to trenches 26. In an embodiment, trench 28 may be formed as a multiply-connected domain with trenches 26 and sections 21 and 22 formed within the domain.

Figure 2:
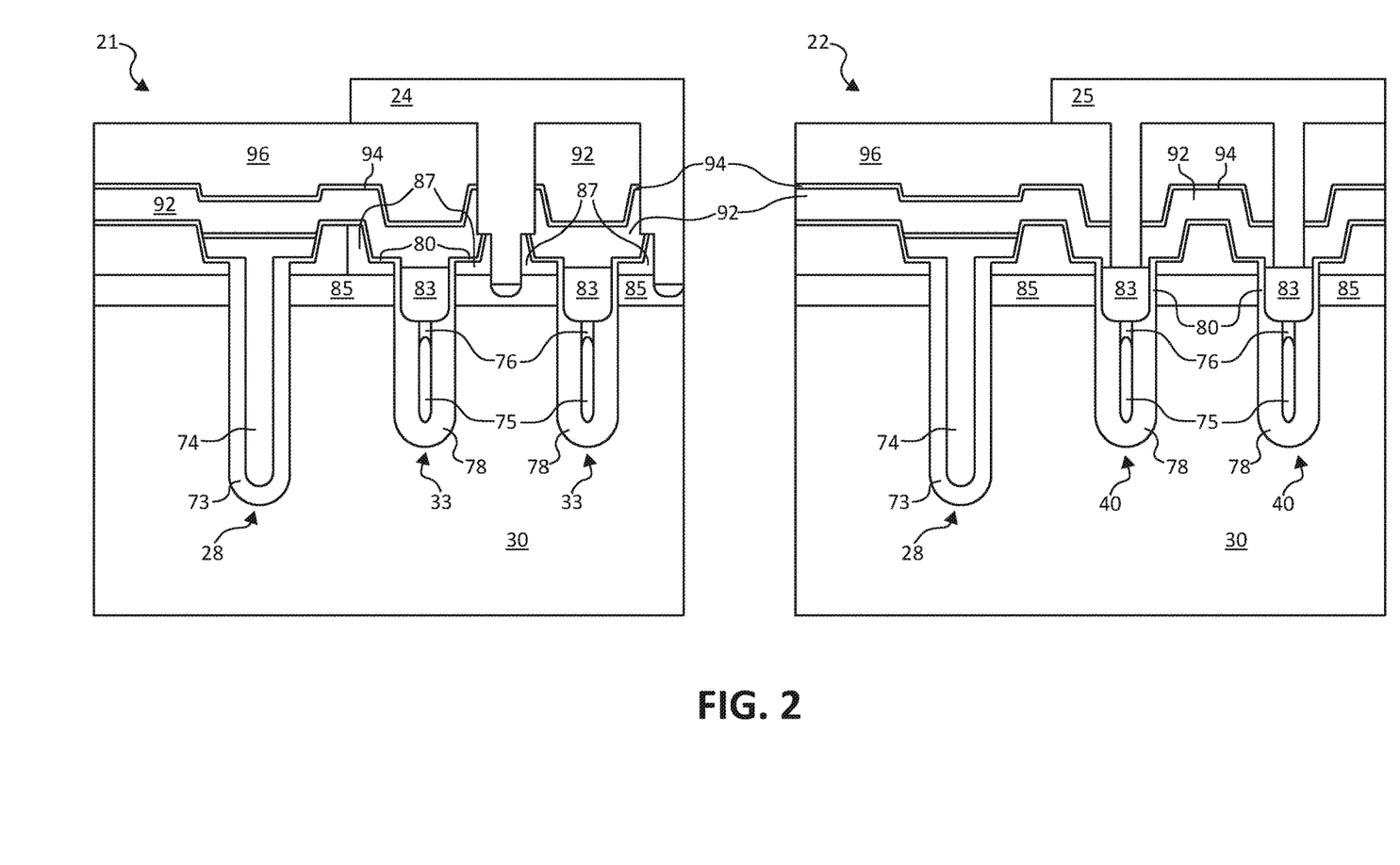
FIG. 2 illustrates an enlarged cross-sectional example of portions of the device of FIG. 1 in accordance with the present invention.

FIG. 2 illustrates an enlarged cross-sectional example of portions of device 20 along cross-sectional lines 2-2 illustrated in FIG. 1. The left-hand portion of FIG. 2 illustrates an example of an embodiment of active portion 33 of trenches 26 and also illustrates trench 28 that is formed in active section 21, and the right-hand portion of FIG. 2 illustrates an example of an embodiment of non-active portion 40 of trenches 26 and also illustrates trench 28 that is formed in non-active section 22.

Figure 3:
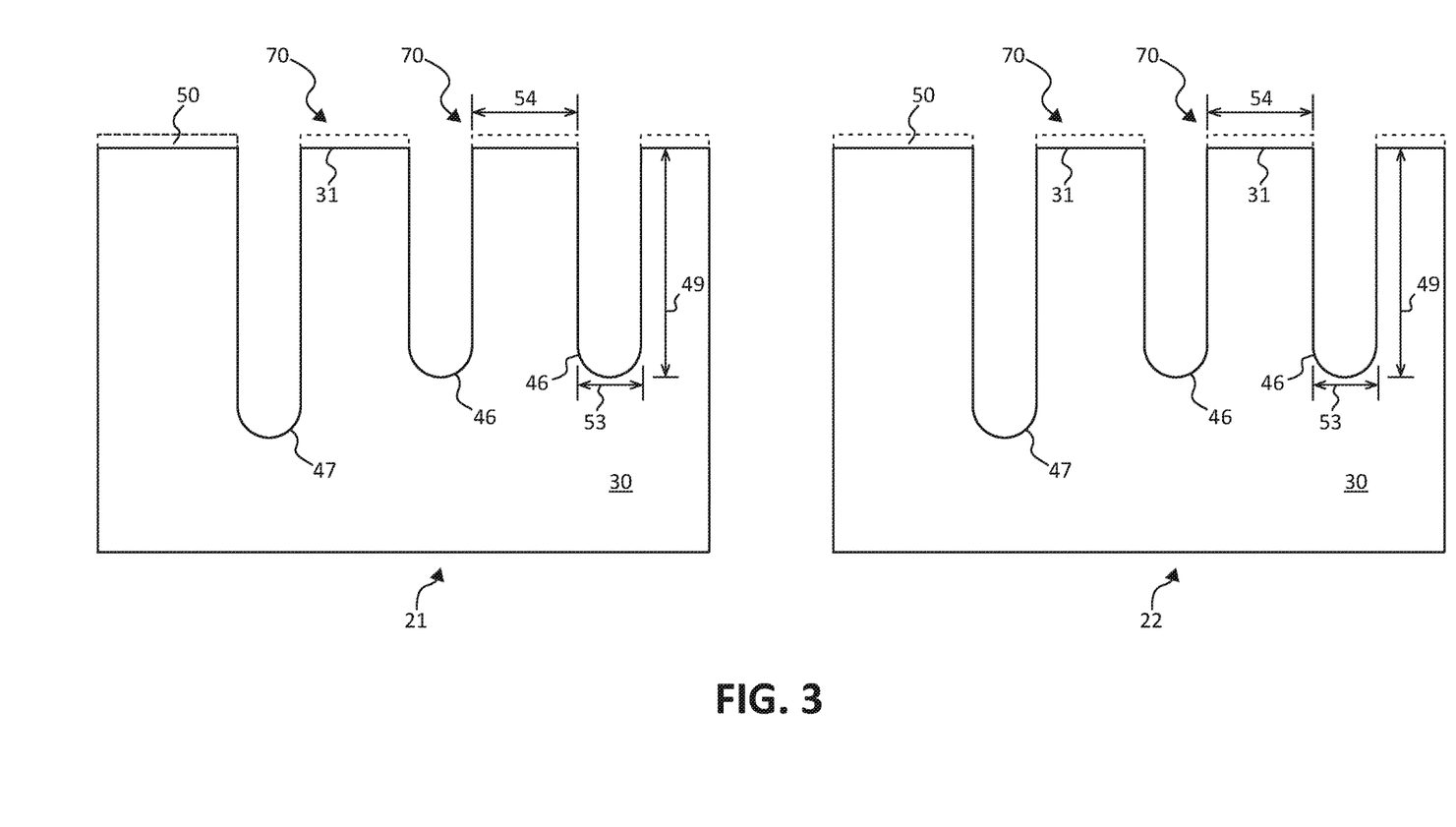
FIG. 3 illustrates an early stage in an example of an embodiment of a method of forming the device of FIGS. 1-2 in accordance with the present invention.

FIG. 3 illustrates an early stage in an example of an embodiment of a method of forming device 20. Device 20 includes a substrate 30 that has a surface 31. Substrate 30 typically is a silicon semiconductor substrate. Substrate 30 may include multiple layers that are not illustrated. For example, substrate 30 may include a bulk silicon semiconductor substrate onto which multiple layers may be formed such as by epitaxial or other well-known processes. An embodiment of substrate 30 may include a bulk silicon semiconductor substrate onto which two or more epitaxial layers are formed. Additionally, substrate 30 may include doped regions that are doped to a particular conductivity type with device 20 formed within that doped region. Such constructs are well known to one skilled in the art.

Openings 46 are formed extending from surface 31 a depth or distance 49 into substrate 30 at regions where trenches 26 are to be positioned. Openings 46 extend along length 48 (FIG. 1). Openings 46 may be formed to have a width 53 and may extend depth 49 from surface 31 into substrate 30. Also, an opening 47 is formed extending from surface 31 into substrate 30 where trench 28 is to be positioned. Openings 46 are separated from each other by a distance or width 54 such that a portion of substrate 30 forms a projection 70 between openings 46. An embodiment may include that a projection 70 may also be formed between opening 47 and an adjacent opening 46. Opening 47 may optionally be formed to extend further than depth 49 into substrate 30. Opening 47 may be formed at the same time as openings 46 or at a different time. In an embodiment, the bottom of openings 46 and 47 may have a rounded shape. Openings 46 and 47 may be formed by trench etching operations that are well-known to those skilled in the art. An embodiment may include forming openings 46 and 47, or alternately trenches 26 and 28 using anisotropic etching techniques.

An embodiment may include forming an optional insulator layer 50 on surface 31 and removing portions of layer 50 where openings 46 and 47 are to be formed. Layer 50 may be silicon dioxide that is formed by oxidizing surface 31. Thereafter, layer 50 and the openings therein may be used as a mask for forming openings 46 and 47.

Figure 4:
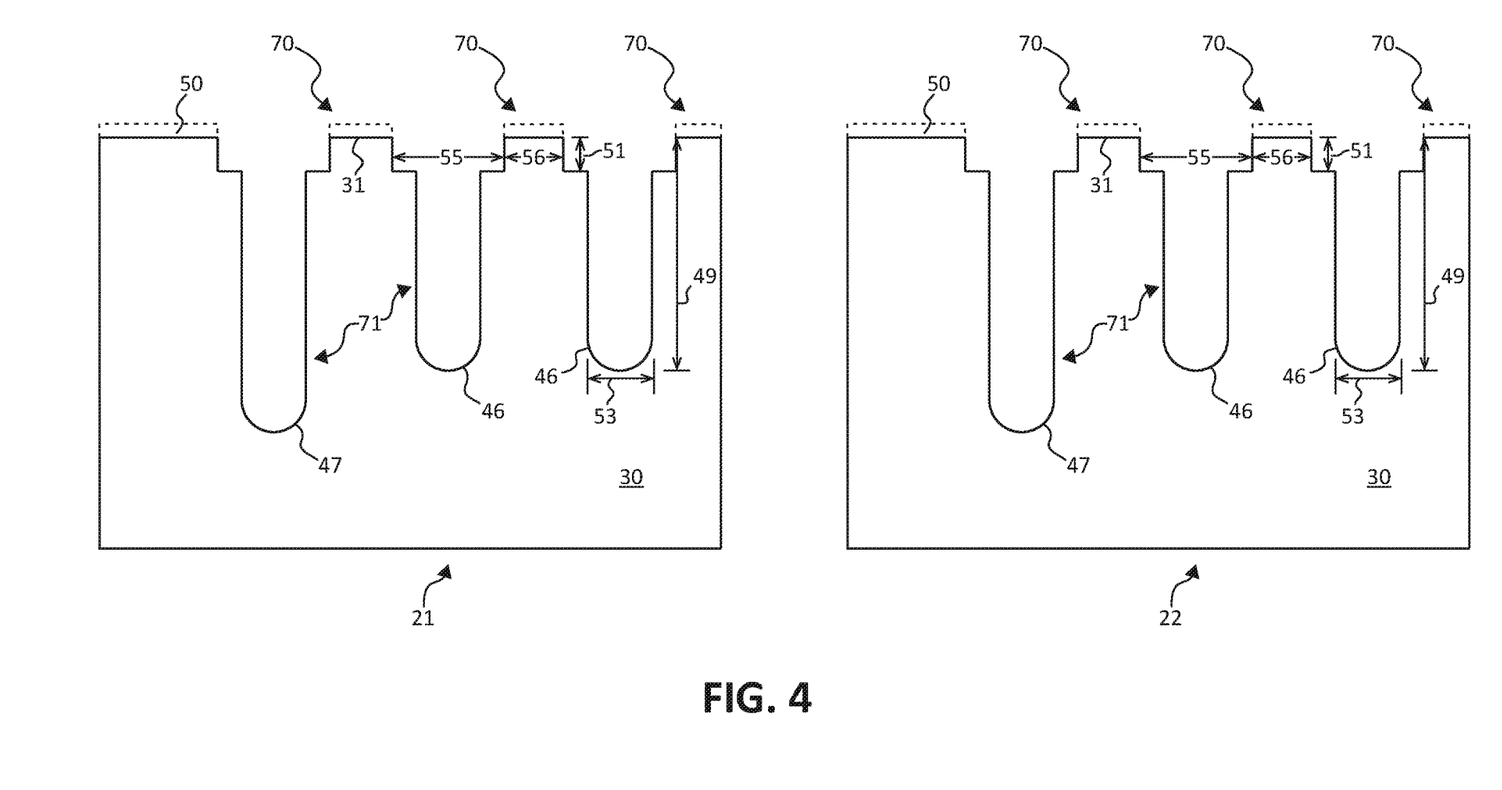
FIG. 4 illustrates an example of a subsequent stage in an embodiment of a method of forming the device of the device of FIGS. 1-2 in accordance with the present invention.

FIG. 4 illustrates an example of a subsequent stage in an embodiment of a method of forming device 20. The width of openings 46 and 47 is expanded near surface 31. The width of openings 46 and 47 is expanded to a width 55 that extends a depth or distance 51 into substrate 30 from surface 31. Depth 51 is much less than depth 49. Expanding the width of openings 46 and 47 reduces the width of projections 70 at surface 31 to a width 56 that extends depth 51 into substrate 30. Width 56 is less than width 54. In an embodiment, width 56 is at least approximately seventy nano-meters (70 nm.) less than width 54. Other embodiments may include that width 56 may be anywhere between approximately seventy nano-meters (70 nm.) to approximately eighty nano-meters (80 nm.) less than width 54.

In an embodiment, an isotropic etch may be used to expand the width of openings 46 and 47. During the operation to expand the width of openings 46 and 47, portions of optional layer 50 may also be removed. Thereafter, the remainder of layer 50 may be removed.

Figure 5:
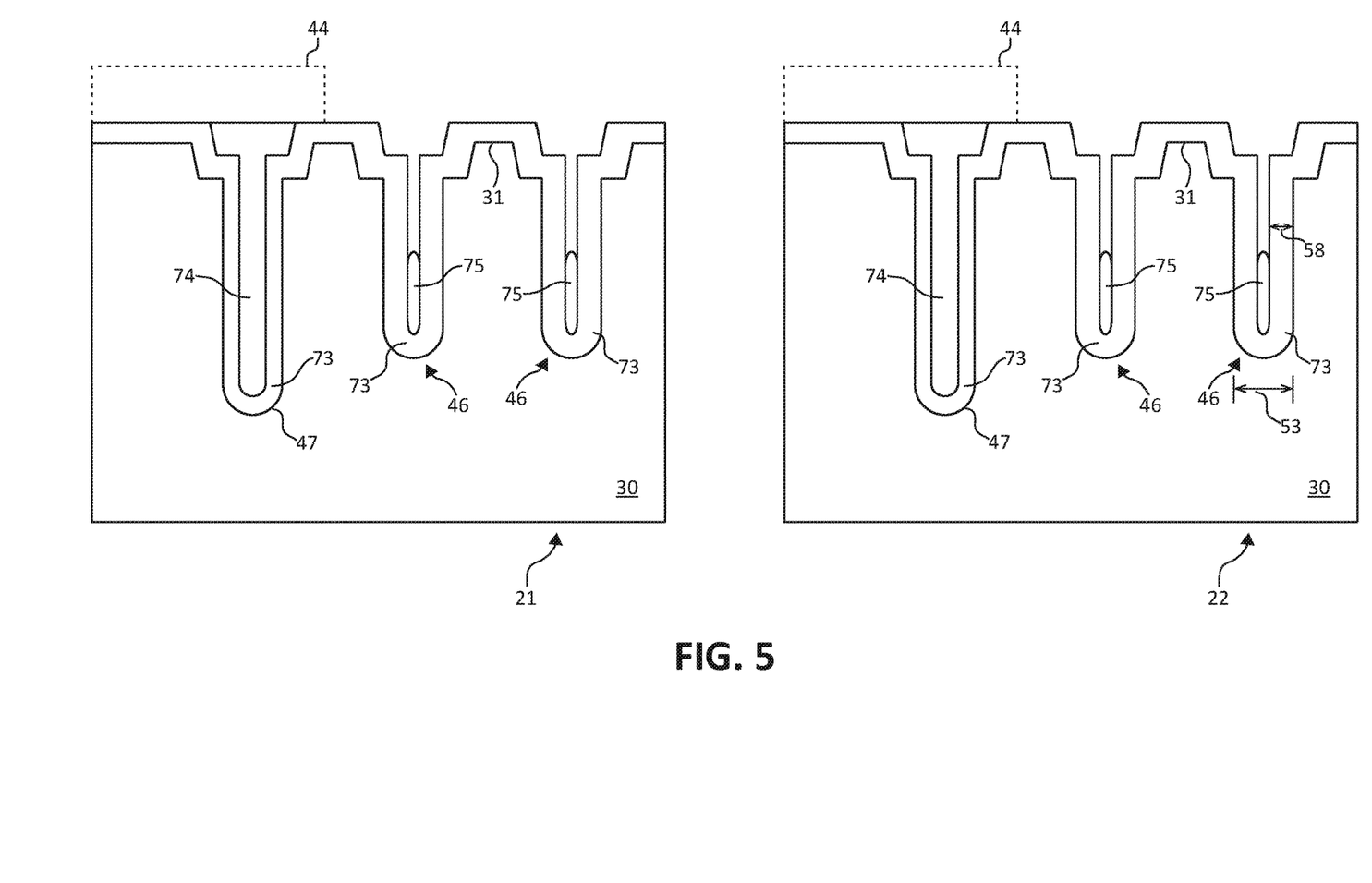
FIG. 5 illustrates another subsequent stage in an embodiment of a method of forming the device of FIGS. 1-2 in accordance with the present invention.

FIG. 5 illustrates another subsequent stage in an embodiment of a method of forming device 20. An insulator 73 is formed along the sidewalls and bottom of openings 46 and 47. In an embodiment, insulator 73 is formed to have a thickness or width 58 along the portion of openings 46 and 47 that have width 53. In other embodiments, insulator 73 may also be formed with width 58 along the sidewalls that have width 55 and along surface 31. An embodiment may include forming insulator 73 from silicon dioxide. For example, exposed portion of substrate 30 may oxidized to form insulator 73.

Subsequently, a shield conductor 75 may be formed in a lower portion of openings 46. A termination conductor 74 may also be formed within the remainder of opening 47. Conductors 74 and 75 may be formed from well-known conductor material such as for example doped polysilicon or other conductor materials.

An embodiment of forming conductors 74 and 75 may include filling openings 46 and 47 with a conductor material. In some embodiments, the conductor material may extend out and onto or overlying surface 31 of substrate 30. For such an embodiment, a planarizing process, such as for example a chemo-mechanical polishing (CMP) process, may be used to remove portions of the conductor material from the surface of substrate 30 and/or the surface of insulator 73 that is formed on surface 31. Thereafter, portions of conductor 75 within openings 46 may be removed. During the process of removing the portions of conductor 75, a mask 44 (illustrated in dashed lines) may be used to protect opening 47 to leave the conductor material as conductor 74 within opening 47. Mask 44 may thereafter be removed.

Figure 6:
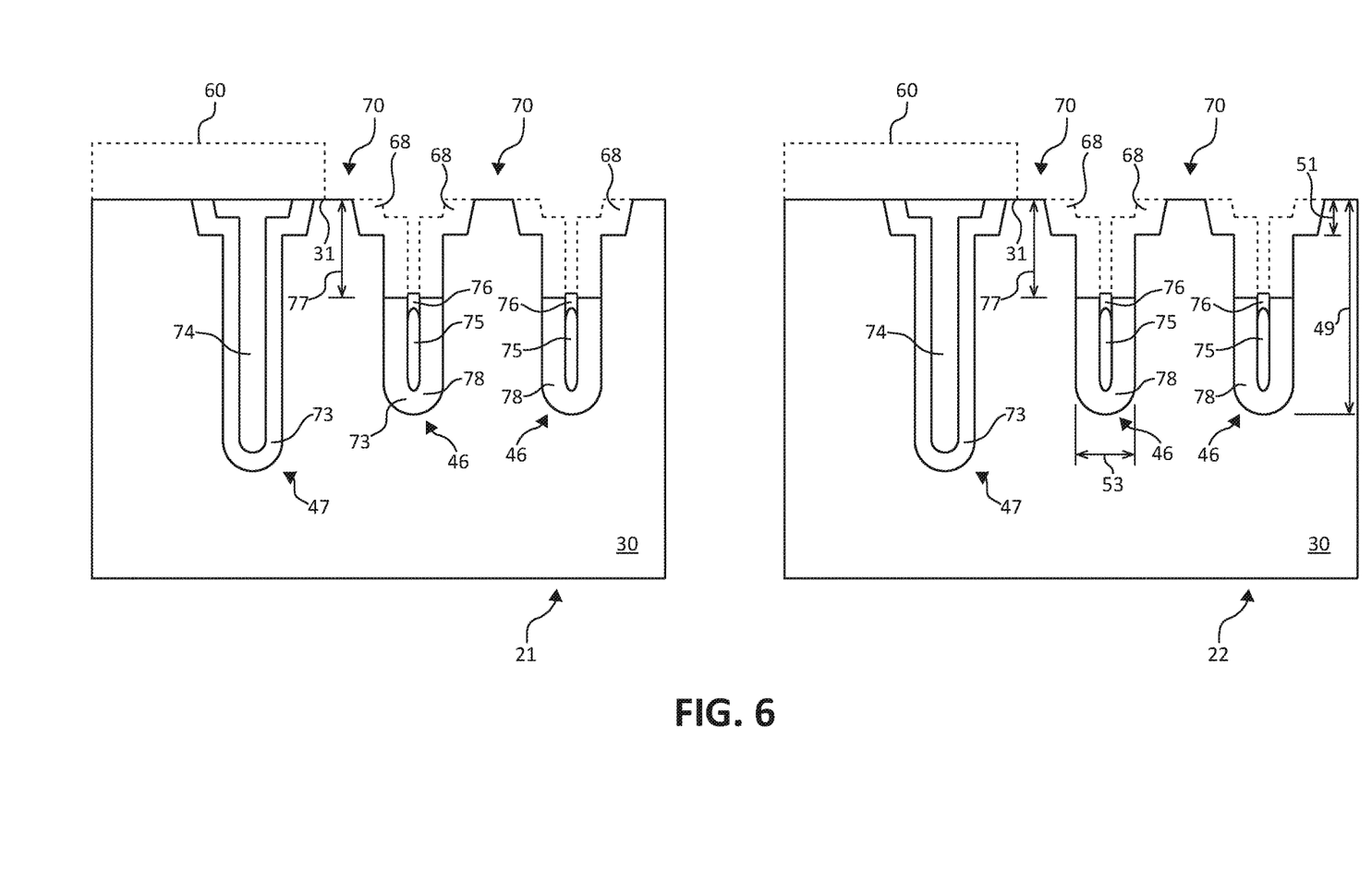
FIG. 6 illustrates yet another subsequent step in an example of an embodiment of a method of forming the device of FIGS. 1-2 in accordance with the present invention.

FIG. 6 illustrates yet another subsequent step in an example of an embodiment of a method of forming device 20. A separator insulator 76 may be formed on conductor 75 within openings 46. Those skilled in the art will understand that insulator 76 separates or isolates conductor 75 from a gate conductor 83 (FIG. 2) as will be explained further hereinafter.

An embodiment of forming insulator 76 may include forming an insulator material within openings 46 and on conductor 75 such that the material fills at least a portion of a remainder of openings 46. The insulator material may also be formed on conductor 74. An embodiment may include forming the insulator material to fill the remainder of opening 46 and extend to overlie surface 31, such as for example form the insulator material overlying insulator 73 that is on surface 31 (FIG. 5). The material used for insulator 76 may be any of a variety of well-known insulator materials such as for example silicon dioxide or other well-known insulator materials. Some embodiments may include removing portions of the insulator material from overlying surface 31 such as for example by planarizing the insulator material. A CMP or other type of planarizing procedure may be used. The removal step also removes portions of insulator 73 that is on surface 31 of substrate 30.

Thereafter, a portion of the insulator material within openings 46 may be removed to a distance or depth 77 leaving a portion of the insulator material on conductor 75 as insulator 76. An embodiment may include forming a mask 60 (illustrated by dashed lines) overlying opening 47 to protect opening 47 and trench 28 during the step of removing the insulator material to depth 77, the portion of insulator 73 that is on the sidewalls of openings 46 is also removed, as is illustrated by dashed lines 68, down to depth 77 thereby leaving a portion of insulator 73 on the sidewalls of openings 46 that are deeper than distance 77, to form an insulator 78 that extends from the bottom of openings 46 toward surface 31 at least up to insulator 76, and optionally adjacent to all of insulator 76. Depth 77 is greater than depth 51 but less than depth 49. Procedures to form insulators 76 and 78 are well-known to those skilled in the art.

Figure 7:
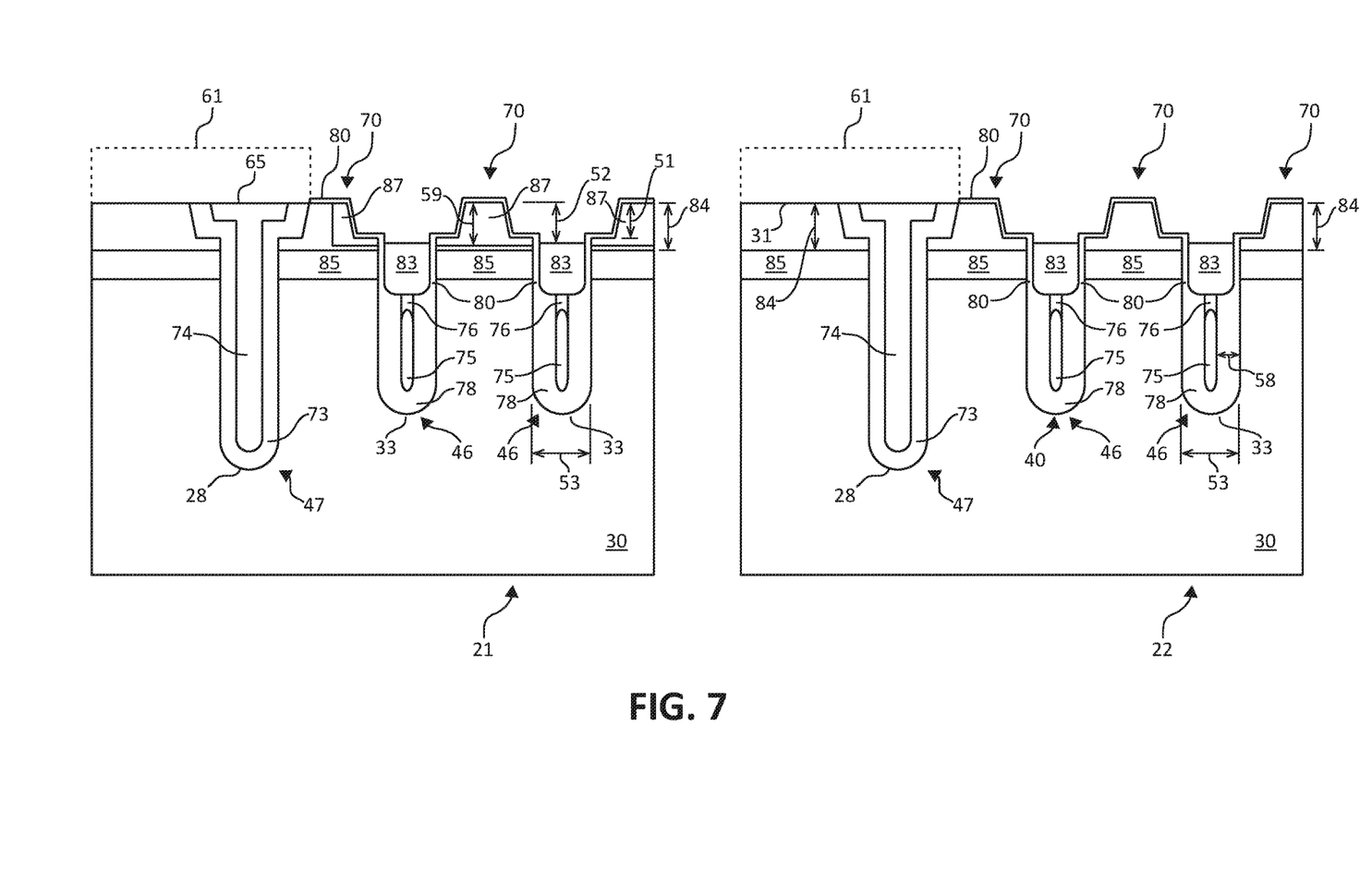
FIG. 7 illustrates yet another subsequent step in an example of an embodiment of a method of forming the device of FIGS. 1-2 in accordance with the present invention.

FIG. 7 illustrates yet another subsequent step in an example of an embodiment of a method of forming device 20. After forming insulators 76 and 78, another insulator 80 is formed on the sidewalls of openings 46 that extend from surface 31 down to depth 77 or alternately to insulator 78. An embodiment may include forming insulator 80 to at least depth 77 into openings 46. Insulator 80 has a thickness that is less than thickness 58 of insulator 78. A portion of insulator 80 may sometimes be referred to as a gate insulator. In an embodiment, insulator 80 may also be formed to extend onto surface 31 and on projections 70 that are positioned between and adjacent to openings 46. Insulator 80 may be a one or more of a variety of well-known insulator materials that may be used as a gate insulator for a transistor. In an embodiment, insulator 80 may be silicon dioxide that is formed by oxidizing the silicon exposed within openings 46 and on surface 31. Even though mask 60 is overlying opening 47, an embodiment may include that a portion of conductor 74 may be oxidized into an insulator 65. Mask 60 may thereafter be removed.

Subsequently, gate conductor 83 may be formed in openings 46. As will be seen further hereinafter, conductor 83 is recessed to a depth 52 from surface 31 such that depth 52 is greater from surface 31 than depth 51. Thus, conductor 83 extends from depth 52 further into openings 46.

An embodiment of a method of forming conductor 83 may include filling the remainder of openings 46 with a conductor material. The conductor material may be formed to fill openings 46 and to extend to overlie surface 31. Portions of the conductor material may be removed to leave conductor material in openings 46. For example, the conductor material may be planarized by CMP or other well-known methods. In some embodiments, a portion of the material of conductor 83 may also be formed on conductor 74 within opening 47. The explanation of the formation of conductor 83 will continue hereinafter.

A doped region 85 may be formed within substrate 30 and extending at least between openings 46. Region 85 may be formed to extend substantially parallel to surface 31. In some embodiments, region 85 may also extend laterally to opening 47, and optionally may extend past opening 47. In some embodiments, region 85 does not extend into section 22. Region 85 is formed to be positioned at least a depth 84 below surface 31 such that depth 84 is no less than depth 52. In an embodiment, depth 84 may be greater than depth 52.

Subsequently, the portion of projections 70 that are within active section 21 and positioned between openings 46, are doped to form doped regions Doped regions 87 may have a conductivity type that is the opposite of the conductivity type of region 85. An embodiment may include that region 87 has an N-type conductivity and region 85 has a P-type conductivity. In an embodiment, region 85 may be formed in a portion of substrate 30 that has the N-type conductivity. Doped regions 87 extend a depth 59 from surface 31 such that depth 59 is greater than depth 51. Regions 87 extend within projections 70 along the sidewall of openings 46 that have width 55 down to the sidewalls that have width 53 such that a portion of doped regions 87 are adjacent insulator 80 that is on sidewalls of the portion of openings 46 that has width 53. In some embodiments, depth 59 is greater than depth 52 such that a portion of regions 87 abut a portion of insulator 80 that is abutting conductor 83. In an embodiment, depth 84 is greater than depth 59 such that regions 87 do not extend as far as depth 84 of region 85. During the process of forming regions 87, the portion of projection 70 that is adjacent opening 47 is masked with another mask 61 (dashed lines) that is similar to mask 60 such that doped region 87 does not extend to be adjacent to insulator 73 that is within opening 47.

Returning back to conductor 83, portions of the conductor material within openings 46 may be removed down to depth 52 to leave conductor 83 within each opening 46. The material used for conductor 83 may be any well-known conductor material that may be used for forming a gate conductor of a MOSFET. For example, the material of conductor 83 may be doped polysilicon, or a silicide, or a salacided, or other well-known conductor materials. Those skilled in the art will appreciate that the order of forming regions 83, 87, and 85 may be different in other embodiments.

Mask 61 may be removed.

Figure 8:
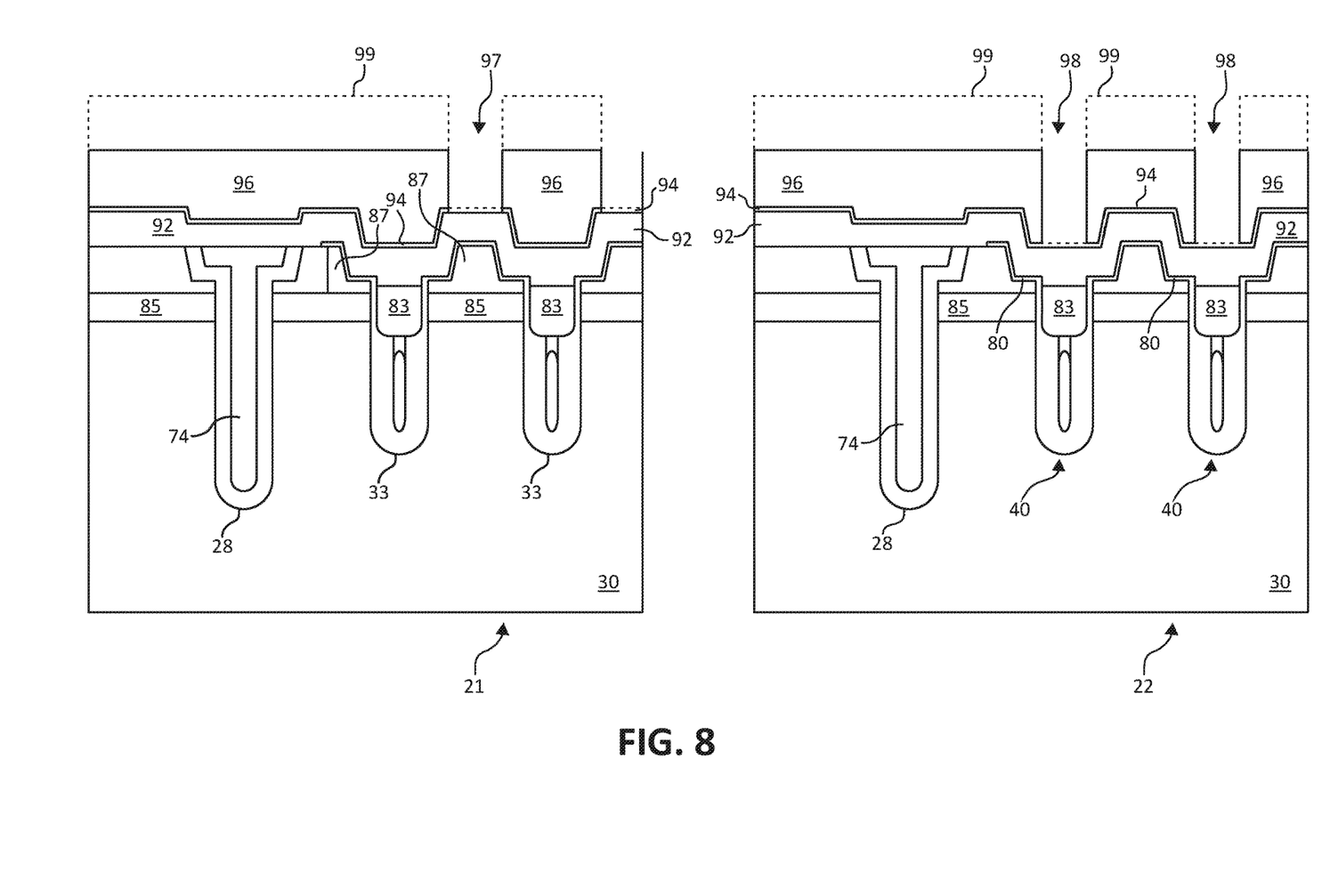
FIG. 8 illustrates another subsequent step in an example of an embodiment of a method of forming the device of FIGS. 1-2 in accordance with the present invention.

FIG. 8 illustrates another subsequent step in an example of an embodiment of a method of forming device 20. An insulator 92 is formed overlying conductors 83 and projections 70. In an embodiment, insulator 92 is formed overlying all of trenches 26. An embodiment may include that insulator 92 is formed overlying all of active section 21 and non-active section 22, and any of surface 31 therebetween. Insulator 92 may have an embodiment which overlies all of surface 31. An embodiment may include that insulator 92 extends into openings 46 sufficiently to touch conductor 83.

A stop layer 94 is formed on insulator 92. An embodiment of stop layer 94 overlies at least all of trenches 26 and projections 70. In an embodiment, stop layer 94 is formed overlying all of insulator 92. An opening is formed overlying layer 94 and at least trenches 26 and projections 70.

A mask 99 is applied and patterned. Mask 99 has mask openings 97 overlying a portion of the length of projections 70 within active section 21 but not in non-active section 22. Mask 99 also has openings 98 overlying a portion of conductors 83 within non-active section 22 but not overlying the portion of conductors 83 that are in active section 21. Openings 97 have a width that is A length of openings 97 extends substantially parallel to length 48 (FIG. 1) but the length of openings 97 is less than the width of section 21. An embodiment of openings 97 have a width that is substantially the same as width 56 (FIG. 4) of the narrow portion of projections 70. However, the width may be different in other embodiments. Substantially simultaneously, openings 98 are formed through opening in a portion of non-active section 22 and overlying a portion of conductor 83. Openings 98 have a length that is substantially parallel to length 48 but is less than a width of section 22. Openings 97 and 98 are formed in opening by removing underlying portions of opening wherein the removing operation substantially ceases upon reaching layer 94. For example, opening may be etched by an etchant that substantially does not etch the material of layer 94. An embodiment may include that layer 94 may be silicon nitride and opening may be silicon dioxide. An embodiment may include that opening is etched with an etchant that is preferential to silicon dioxide over silicon nitride. In an embodiment, opening may be etched with a fluorine based etchant that does not substantially affect the material layer 94. Because the removal substantially stops after reaching layer 94, the removal operation is substantially independent of the thickness of opening.

Subsequently, the portion of layer 94 exposed within openings 97 and 98 is removed (as illustrated by the dashed line portions of layer 94) to expose the underlying portion of insulator 92. In an embodiment, the operation to remove layer 94 substantially ceases upon reaching insulator 92. For example, layer 94 may be etched by an etchant that substantially does not etch the material of insulator 92. An embodiment may include that layer 94 may phosphosilicate glass (PSG) or silicon dioxide or other material that is not etched by the etching of layer 94. In an embodiment, the operation to remove layer 94 is preferential to silicon nitride over silicon or silicon diode, thus, the removal does not substantially affect the material of layers 96 or 92. An embodiment may include that layer 94 may be etched with an etchant that substantially does not affect the material of insulator 92.

Figure 9:
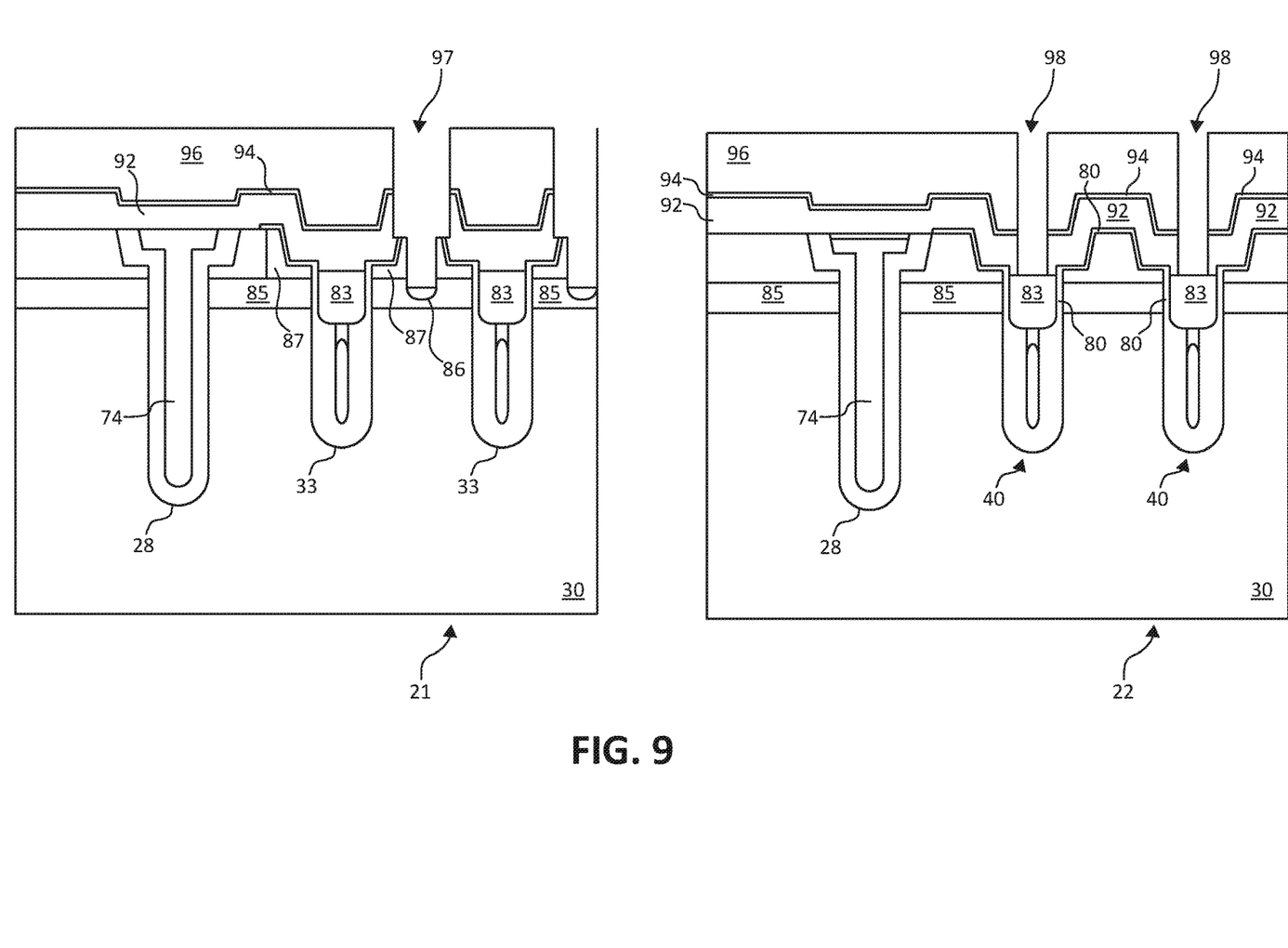
FIG. 9 illustrates yet another subsequent step in an example of an embodiment of a method of forming the device of FIGS. 1-2 in accordance with the present invention.

FIG. 9 illustrates yet another subsequent step in an example of an embodiment of a method of forming device 20. Openings 97 are extended through insulator 92 and through insulator 80 to at least expose projections 70 (as illustrated by the dashed line representing a top of projection 70), or alternately at least expose regions 87. Substantially simultaneously, openings 98 are also extended through insulator 92 to at least expose conductor 83. In an embodiment, insulator 92 is etched through openings 97 and 98 using an etchant that etches silicon dioxide faster than silicon or silicon nitride to remove the material of insulators 92 and 80 and not substantially affect the material of projections 70 and conductor 83.

Thereafter, each opening 97 is extended through the corresponding projection 70 and region 87 to at least expose doped region 85. An embodiment of the removal operation is preferential to silicon over silicon dioxide or silicon nitride. Therefore, if opening 97 is slightly offset from the middle of projection 70, the removal does not substantially affect the material of insulator 92, thus, the removal does extend opening 97 laterally to expose conductors 83. Therefore, since regions 87 have silicon dioxide on the sidewalls thereof, subsequently formed electrode 24 can not contact conductor 83. Additionally, the portion of opening 97 through region 87 is substantially self-aligned to trenches 33. For example, the portion of opening 97 may be substantially equidistant from each trench 33 that is on opposite sides of opening 97. Thus, the portion of source electrode that contacts region 87 is self-aligned to trenches 33. Although the lower portion of opening 97 is narrower than the upper portion of opening 97, both portions may be the same width is some embodiments.

Substantially simultaneously, each opening 98 may be extended into the material of the corresponding conductor 83. In the event that conductor 83 is a salacided or a silicided material, opening 98 will extend only slightly into conductor 83. In the event that conductor 83 is doped polysilicon that is not a silicided or salacided material, opening 98 may extend into the material of conductor 83 as illustrated by the dashed lines. In some embodiments, openings 97 through region 87 may be referred to as a source contact opening, and openings 98 that expose conductor 83 may be referred to as gate contact openings.

Using the same removal operation to form both openings 97 and 98 saves manufacturing operations that previously used one set of operations to form a source contact opening, such as for example opening 97, and a separate set of operations to form gate contact openings, such as for example openings 98. Thus, the current method saves costs.

Referring back to FIGS. 1-2, a mask may be applied and patterned with a mask opening overlying at least openings 97 and a separate mask opening overlying at least openings 98. The mask openings may extend to also expose a portion of opening that is adjacent to openings 97 and 98. Thereafter, a conductor material is applied to fill openings 97 and form source electrode 24 within openings 97 and electrically contacting doped region 87 and doped region 85. The conductor material in section 21 may extend to overlie surface 31 between openings 97 of all of trenches 26. The conductor material also forms gate electrode 25 in openings 98. The conductor material in section 22 also extends to overlie surface 31 between openings 98 of all of trenches 26.

The conductor material may be any well-know conductor materials. An embodiment may include that the conductor material is a multi-layer metal that includes titanium and a barrier layer of Titanium nitride (TiN).

From all the foregoing, one skilled in the art will understand that an example of an embodiment of a method of forming a semiconductor device may comprise:

providing a substrate, such as for example substrate 30, having a first surface, such as for example the top surface, the substrate being a semiconductor substrate of a first conductivity type, such as for example N-type;

forming a plurality of gate trench openings, such as for example openings 46-47, of a first width, such as for example a width 53, extending a first distance, such as for example distance 49, into the substrate wherein each gate trench opening, such as for example openings for trenches 33, is in an active region, such as for example region 21, of the semiconductor device and has a length, such as for example length 48, that extends, such as for example portion 40, from the active region into a non-active region, such as for example region 22, of the semiconductor device;

forming a termination trench opening, such as for example opening 47 of trench 28, of the first width extending into the substrate wherein the termination trench opening surrounds the plurality of gate trench openings, and wherein the plurality of gate trench openings leaves a projection of the substrate having a second width, such as for example width 54, interposed between each gate trench opening and also along an outside edge of the termination trench opening;

expanding the first width to a third width, such as for example width 55, wherein the third width extends a second distance, such as for example a distance 51, into the substrate that is less than the first distance thereby reducing the second width of the projection to a fourth width, such as for example a width 56, wherein the fourth width extends substantially the second distance into the substrate;

forming a first insulator, such as for example insulator 78, having a first thickness along at least a first portion of sidewalls of the plurality of gate trench openings that have the first width wherein the first insulator extends from a bottom of the plurality of gate trench openings a third distance toward the first surface;

forming a second insulator, such as for example insulator 80, having a second thickness along another portion of the sidewalls wherein the second insulator extends from the third distance toward the first surface;

forming a gate conductor, such as for example conductor 83, in the plurality of gate trench openings and abutting the second insulator;

forming a third insulator, such as for example insulator 92, overlying the gate conductor and the projection;

forming an etch stop layer, such as for example layer 94, on the third insulator;

forming a fourth insulator, such as for example insulator 96, overlying the etch stop layer wherein a material of the etch stop layer is not affected by operations that remove material of the fourth insulator;

etching portions of the fourth insulator overlying the projection for forming a first opening through the fourth insulator and etching portions of the fourth insulator the gate conductor in the non-active region of the plurality of gate trench openings for forming a second opening through the fourth insulator wherein the etching is substantially stopped on the etch stop layer;

extending the first opening and the second opening through the etch stop layer;

etching exposed portions of the third insulator through the first opening and into the projection and through the second opening to expose the gate conductor;

forming a source electrode overlying the projection and the plurality of gate trench openings in the active region and extending through the first opening to make an electrical connection to the projection; and forming a gate electrode overlying the plurality of gate trench openings in the non-active region and extending through the second opening to make an electrical connection to the gate conductor.

An embodiment of the method may also include forming the etch stop layer from a material that is not etched by enchants that can etch the material of the fourth insulator.

Another embodiment may include forming the etch stop layer forming the etch stop layer from silicon nitride.

An embodiment may also include doping portions of the projection to form first doped regions of the first conductivity type within the projection and adjacent the second insulator that is on the sidewalls.

An embodiment of the method may also include forming a first doped region of a second conductivity type in the substrate adjacent to the second insulator and underlying the projection wherein the first doped region extends laterally between each of the plurality of gate trench openings.

In an embodiment, the method may include doping portions of the projection to form a second doped region of the first conductivity type overlying the first doped region.

An embodiment may also include etching through the projection to at least expose the first doped region.

Another embodiment may include forming the gate conductor from doped polysilicon.

An embodiment of the method may also include, after etching exposed portions of the third insulator, saliciding at least a portion of the gate conductor.

The method may also have an embodiment that may include, after the step of forming the first insulator, forming a shield conductor within the plurality of gate trench openings and abutting the first insulator.

An embodiment may include forming a separator insulator overlying the shield conductor and positioned between the shield conductor and the gate conductor.

Those skilled in the art will also appreciate that another example of an embodiment of a method of forming a semiconductor device may comprise:

providing a substrate having a first surface, the substrate being a semiconductor substrate of a first conductivity type;

forming a plurality of gate trench openings of a first width, for example width 53, extending a first distance, for example a distance 49, into the substrate wherein each gate trench opening is in an active region, such as for example region 21, of the semiconductor device and has a length, such as for example length 48, that extends from the active region into a non-active region, such as for example region 22, of the semiconductor device wherein the plurality of gate trench openings leaves a projection of the substrate having a second width, such as for example width 54, interposed between each gate trench opening;

expanding the first width to a third width, such as for example width 55, wherein the third width extends a second distance, such as for example a distance 51, into the substrate that is less than the first distance thereby reducing the second width of the projection to a fourth width, such as for example width 56, wherein the fourth width extends substantially the second distance into the substrate;

forming a gate insulator, such as for example insulator 80, having a first thickness along at least a first portion of sidewalls of the plurality of gate trench openings;

forming a gate conductor, such as for example conductor 83, in the plurality of gate trench openings and abutting a first portion of the gate insulator that is positioned along the first width of the plurality of gate trench openings;

forming a first insulator, such as for example insulator 92, overlying the gate conductor and the projection;

forming a stop layer, such as for example layer 94, on the first insulator;

forming a second insulator, such as for example insulator 96, overlying the stop layer wherein a material of the stop layer is not affected by operations that remove material of the second insulator;

removing portions of the second insulator overlying the projection for forming a first opening through the second insulator and substantially simultaneously removing portions of the second insulator overlying the gate conductor in the non-active region of the plurality of gate trench openings for forming a second opening through the second insulator wherein the removing is substantially stopped on the stop layer;

extending the first opening and the second opening through the stop layer;

extending the first opening and the second opening through exposed portions of the first insulator including extending the first opening into the projection and extending the second opening to expose the gate conductor; and forming a first electrode overlying the projection and the plurality of gate trench openings in the active region wherein the first conductor extends through the first opening to make an electrical connection to underlying portions of the projection, and forming a gate electrode overlying the plurality of gate trench openings in the non-active region and extending through the second opening to make an electrical connection to the gate conductor.

The method may also have an embodiment that may include forming a mask overlying a portion of plurality of gate trench openings that is positioned between the active region and the non-active region wherein the first opening is exposed in a first mask opening of the mask and the second opening is exposed in a second mask opening of the mask, thereafter applying a conductor material to form the first electrode and the gate electrode.

An embodiment may also include forming a first doped region of a second conductivity type within the substrate and abutting the gate insulator wherein the first doped region extends between each gate trench opening.

In an embodiment, the method may include extending the first opening into the projection includes extending the first opening to at least touch the first doped region.

Another embodiment may include doping a portion of the projection with a first conductivity type to form a source region of the semiconductor device.

Those skilled in the art will also appreciate that an example of an embodiment of a method of forming a semiconductor device may comprise:

providing a semiconductor substrate having a first surface;

forming a plurality of gate trench openings of a first width, such as for example width 53, extending a first distance into the semiconductor substrate and leaving a projection, such as for example projection 70, of the semiconductor substrate having a second width between the plurality of gate trench openings wherein of each gate trench opening has a length, such as for example link 48, along the first surface that extends from an active region of the semiconductor device into a non-active region of the semiconductor device;

expanding the first width of each gate trench opening to a third width, such as for example with 55, for at least a second distance from the first surface wherein the second distance is less than the first distance thereby leaving each gate trench opening with the first width along a remainder of the first distance, wherein expanding the first width reduces the second width of the projection to a fourth width, such as for example width 56, for at least the second distance;

forming a gate conductor in each of the plurality of gate trench openings;

forming a first insulator, such as for example insulator 92 and/or 80, if on sidewalls of the projection that has the fourth width;

forming a stop layer, such as for example layer 94, overlying the first insulator;

forming a second insulator, such as for example insulator 96, overlying the stop layer;

forming a first opening through the second insulator overlying a portion of the projection that is in the active region and substantially simultaneously forming a second opening through the second insulator overlying a portion of the gate conductor that is in the non-active region wherein the first opening and the second opening are substantially stopped on the stop layer;

extending the first opening and the second opening through the first insulator including extending the first opening into the projection; and forming a first electrode overlying the projection and the plurality of gate trench openings in the active region wherein the first electrode extends through the first opening to make an electrical connection to the projection, and forming a gate electrode overlying the plurality of gate trench openings in the non-active region and extending through the second opening to make an electrical connection to the gate conductor.

An embodiment of the method may also include forming the gate conductor includes forming the gate conductor and each gate trench opening wherein the gate conductor extends from within the active region into the non-active region.

The method may have an embodiment that may also include forming the stop layer includes forming the stop layer from a material that is not etched by an etchant that can etch the second insulator.

Another embodiment may include doping a portion of the projection to form a first doped region in the projection wherein the doping is performed prior to the step of forming the first insulator.

In view of all of the above, it is evident that a novel device and method is disclosed. Included, among other features, is forming a semiconductor device having projections that are positioned between gate trenches wherein a portion of the projections near the surface have a narrow width than underlying portions of the projections. The narrow portions of the projections have sidewalls that have a material on the sidewalls that is not substantially etched by an etchant that etches the material of the projections. Thereby resulting in self-alignment between the source contact and active trench portion 33. Such a method of forming the semiconductor device improves the reliability of the source connections and provides a more reliable Rdson for the device and an improved UIS performance.

Additionally, forming source contact opening and gate contact openings substantially simultaneously reduces the manufacturing cost of the semiconductor device.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, different steps may be used to form the semiconductor device as long as the steps form a material along the sidewalls of the projections that is not substantially etched by the removal of the projections, and as long as the source and gate contact openings are formed with substantially simultaneous operations.

The subject matter has been described for a particular MOSFET structure, although the method is directly applicable to other transistor structures, including BiCMOS, metal semiconductor FETs (MESFETs), HFETs, other transistor structures, and diodes.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device comprising:
   providing a substrate having a first surface, the substrate being a semiconductor substrate of a first conductivity type;
   forming a plurality of gate trench openings of a first width extending a first distance into the substrate wherein each gate trench opening is in an active region of the semiconductor device and has a length that extends from the active region into a non-active region of the semiconductor device;
   forming a termination trench opening of the first width extending into the substrate wherein the termination trench opening surrounds the plurality of gate trench openings, and wherein the plurality of gate trench openings leaves a projection of the substrate having a second width interposed between each gate trench opening and also along an outside edge of the termination trench opening;
   expanding the first width to a third width wherein the third width extends a second distance into the substrate that is less than the first distance thereby reducing the second width of the projection to a fourth width wherein the fourth width extends substantially the second distance into the substrate;
   forming a first insulator having a first thickness along at least a first portion of sidewalls of the plurality of gate trench openings that have the first width wherein the first insulator extends from a bottom of the plurality of gate trench openings a third distance toward the first surface;
   forming a second insulator having a second thickness along another portion of the sidewalls wherein the second insulator extends from the third distance toward the first surface;
   forming a gate conductor in the plurality of gate trench openings and abutting the second insulator;
   forming a third insulator overlying the gate conductor and the projection;
   forming an etch stop layer on the third insulator;
   forming a fourth insulator overlying the etch stop layer wherein a material of the etch stop layer is not affected by operations that remove material of the fourth insulator;
   etching portions of the fourth insulator overlying the projection for forming a first opening through the fourth insulator and etching portions of the fourth insulator the gate conductor in the non-active region of the plurality of gate trench openings for forming a second opening through the fourth insulator wherein the etching is substantially stopped on the etch stop layer;
   extending the first opening and the second opening through the etch stop layer;
   etching exposed portions of the third insulator through the first opening and into the projection and through the second opening to expose the gate conductor;
   forming a source electrode overlying the projection and the plurality of gate trench openings in the active region and extending through the first opening to make an electrical connection to the projection; and
   forming a gate electrode overlying the plurality of gate trench openings in the non-active region and extending through the second opening to make an electrical connection to the gate conductor.

2. The method of claim 1 wherein forming the etch stop layer on the third insulator includes forming the etch stop layer from a material that is not etched by enchants that can etch the material of the fourth insulator.

3. The method of claim 2 wherein forming the etch stop layer includes forming the etch stop layer from silicon nitride.

4. The method of claim 1 further including doping portions of the projection to form first doped regions of the first conductivity type within the projection and adjacent the second insulator that is on the sidewalls.

5. The method of claim 1 further including forming a first doped region of a second conductivity type in the substrate adjacent to the second insulator and underlying the projection wherein the first doped region extends laterally between each of the plurality of gate trench openings.

6. The method of claim 5 further including doping portions of the projection to form a second doped region of the first conductivity type overlying the first doped region.

7. The method of claim 5 wherein etching exposed portions of the third insulator through the first opening and into the projection includes etching through the projection to at least expose the first doped region.

8. The method of claim 1 wherein forming the gate conductor includes forming the gate conductor from doped polysilicon.

9. The method of claim 8 further including, after etching exposed portions of the third insulator, saliciding at least a portion of the gate conductor.

10. The method of claim 1 further including, after the step of forming the first insulator, forming a shield conductor within the plurality of gate trench openings and abutting the first insulator.

11. The method of claim 10 further including forming a separator insulator overlying the shield conductor and positioned between the shield conductor and the gate conductor.

12. A method of forming a semiconductor device comprising:
providing a substrate having a first surface, the substrate being a semiconductor substrate of a first conductivity type;
forming a plurality of gate trench openings of a first width extending a first distance into the substrate wherein each gate trench opening is in an active region of the semiconductor device and has a length that extends from the active region into a non-active region of the semiconductor device wherein the plurality of gate trench openings leaves a projection of the substrate having a second width interposed between each gate trench opening;
expanding the first width to a third width wherein the third width extends a second distance into the substrate that is less than the first distance thereby reducing the second width of the projection to a fourth width wherein the fourth width extends substantially the second distance into the substrate;
forming a gate insulator having a first thickness along at least a first portion of sidewalls of the plurality of gate trench openings;
forming a gate conductor in the plurality of gate trench openings and abutting a first portion of the gate insulator that is positioned along the first width of the plurality of gate trench openings;
forming a first insulator overlying the gate conductor and the projection;
forming a stop layer on the first insulator;
forming a second insulator overlying the stop layer wherein a material of the stop layer is not affected by operations that remove material of the second insulator;
removing portions of the second insulator overlying the projection for forming a first opening through the second insulator and substantially simultaneously removing portions of the second insulator overlying the gate conductor in the non-active region of the plurality of gate trench openings for forming a second opening through the second insulator wherein the removing is substantially stopped on the stop layer;
extending the first opening and the second opening through the stop layer;
extending the first opening and the second opening through exposed portions of the first insulator including extending the first opening into the projection and extending the second opening to expose the gate conductor; and
forming a first electrode overlying the projection and the plurality of gate trench openings in the active region wherein the first conductor extends through the first opening to make an electrical connection to underlying portions of the projection, and forming a gate electrode overlying the plurality of gate trench openings in the non-active region and extending through the second opening to make an electrical connection to the gate conductor.

13. The method of claim 12 wherein forming the first electrode and the gate electrode includes forming a mask overlying a portion of plurality of gate trench openings that is positioned between the active region and the non-active region wherein the first opening is exposed in a first mask opening of the mask and the second opening is exposed in a second mask opening of the mask, thereafter applying a conductor material to form the first electrode and the gate electrode.

14. The method of claim 12 further including forming a first doped region of a second conductivity type within the substrate and abutting the gate insulator wherein the first doped region extends between each gate trench opening.

15. The method of claim 14 wherein extending the first opening into the projection includes extending the first opening to at least touch the first doped region.

16. The method of claim 12 further including doping a portion of the projection with a first conductivity type to form a source region of the semiconductor device.

17. A method of forming a semiconductor device comprising:
providing a semiconductor substrate having a first surface;
forming a plurality of gate trench openings of a first width extending a first distance into the semiconductor substrate and leaving a projection of the semiconductor substrate having a second width between the plurality of gate trench openings wherein of each gate trench opening has a length along the first surface that extends from an active region of the semiconductor device into a non-active region of the semiconductor device;
expanding the first width of each gate trench opening to a third width for at least a second distance from the first surface wherein the second distance is less than the first distance thereby leaving each gate trench opening with the first width along a remainder of the first distance, wherein expanding the first width reduces the second width of the projection to a fourth width for at least the second distance;
forming a gate conductor in each of the plurality of gate trench openings;
forming a first insulator on sidewalls of the projection that has the fourth width;
forming a stop layer overlying the first insulator;
forming a second insulator overlying the stop layer;
forming a first opening through the second insulator overlying a portion of the projection that is in the active region and substantially simultaneously forming a second opening through the second insulator overlying a portion of the gate conductor that is in the non-active region wherein the first opening and the second opening are substantially stopped on the stop layer;
extending the first opening and the second opening through the first insulator including extending the first opening into the projection; and
forming a first electrode overlying the projection and the plurality of gate trench openings in the active region wherein the first electrode extends through the first opening to make an electrical connection to the projection, and forming a gate electrode overlying the plurality of gate trench openings in the non-active region and extending through the second opening to make an electrical connection to the gate conductor.

18. The method of claim 17 wherein forming the gate conductor includes forming the gate conductor and each gate trench opening wherein the gate conductor extends from within the active region into the non-active region.

19. The method of claim 17 wherein forming the stop layer includes forming the stop layer from a material that is not etched by an etchant that can etch the second insulator.

20. The method of claim 17 further including doping a portion of the projection to form a first doped region in the projection wherein the doping is performed prior to the step of forming the first insulator.

* * * * *